(12) United States Patent
Xu et al.

(10) Patent No.: US 8,941,357 B2
(45) Date of Patent: Jan. 27, 2015

(54) HEATING CIRCUITS AND METHODS BASED ON BATTERY DISCHARGING AND CHARGING USING RESONANCE COMPONENTS IN SERIES AND FREEWHEELING CIRCUIT COMPONENTS

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 636 days.

(21) Appl. No.: 13/184,906

(22) Filed: Jul. 18, 2011

(65) Prior Publication Data
US 2012/0025780 A1   Feb. 2, 2012

(30) Foreign Application Priority Data

Jul. 30, 2010   (CN) .......................... 2010 1 0245288
Aug. 30, 2010  (CN) .......................... 2010 1 0274785
Dec. 23, 2010  (CN) .......................... 2010 1 0603719

(51) Int. Cl.
*H01M 10/46*      (2006.01)
*H02J 7/00*       (2006.01)
(Continued)

(52) U.S. Cl.
CPC ......... *H01L 23/345* (2013.01); *H01M 10/5006* (2013.01); *H01M 10/5016* (2013.01);
(Continued)

(58) Field of Classification Search
USPC ................................................ 320/129, 118
See application file for complete search history.

(56) References Cited

U.S. PATENT DOCUMENTS 3,654,426 A   4/1972   Brinkmann et al.
3,808,481 A   4/1974   Rippel
(Continued)

FOREIGN PATENT DOCUMENTS

CN   1630129 A   6/2005
CN   1630130 A   6/2005
(Continued)

OTHER PUBLICATIONS

European Patent Office, Extended European Search Report dated Sep. 13, 2011, in related application EP 11166955.2.
(Continued)

*Primary Examiner* — Samuel Berhanu
*Assistant Examiner* — Jerry D Robbins
(74) *Attorney, Agent, or Firm* — Jones Day

(57) ABSTRACT

A circuit for heating a battery includes a switch unit, switching control module, damping component, energy storage circuit, and freewheeling circuit. The energy storage circuit is connected with the battery, and includes a current storage component and charge storage component. The damping component, switch unit, current storage component, and charge storage component are connected in series. The switching control module is connected with the switch unit, and is configured to control switching on and off of the switch unit so that current can flow back-and-forth between the battery and energy storage circuit when the switch unit switches on, and amplitude of the current flowing from the energy storage circuit to the battery can be controlled. The freewheeling circuit is configured to sustain the current flowing to the battery when there is current flowing from the energy storage circuit to the battery and after the switch unit switches off.

32 Claims, 14 Drawing Sheets

(51) Int. Cl.
*H01L 23/34* (2006.01)
*H01M 10/615* (2014.01)
*H01M 10/625* (2014.01)
*H01M 10/657* (2014.01)
*H01M 10/6571* (2014.01)
*H02M 3/158* (2006.01)

(52) U.S. Cl.
CPC ...... *H01M10/5081* (2013.01); *H01M 10/5083* (2013.01); *H02J 7/0054* (2013.01); *H02J 7/0014* (2013.01); *H02M 3/158* (2013.01); *Y02T 10/7055* (2013.01); *H02J 7/0075* (2013.01); *H02J 7/0091* (2013.01); *H02J 7/0093* (2013.01); *Y02E 60/12* (2013.01)
USPC .......................... 320/128; 320/107; 320/129

(56) References Cited

U.S. PATENT DOCUMENTS

| | | | |
|---|---|---|---|
| 4,171,508 A | 10/1979 | Sinclair | |
| 4,222,000 A | 9/1980 | Silvertown et al. | |
| 5,362,942 A * | 11/1994 | Vanderslice et al. | 219/209 |
| 5,396,165 A * | 3/1995 | Hwang et al. | 323/210 |
| 5,461,556 A * | 10/1995 | Horie et al. | 363/58 |
| 5,523,671 A | 6/1996 | Stewart | |
| 5,768,114 A * | 6/1998 | Gruning et al. | 363/58 |
| 5,789,905 A * | 8/1998 | Yamasaki | 323/222 |
| 5,808,469 A | 9/1998 | Kopera | |
| 5,905,371 A | 5/1999 | Limpaecher | |
| 5,943,224 A | 8/1999 | Mao | |
| 5,948,298 A | 9/1999 | Ijaz | |
| 5,990,661 A | 11/1999 | Ashtiani et al. | |
| 6,002,240 A | 12/1999 | McMahan et al. | |
| 6,072,301 A * | 6/2000 | Ashtiani et al. | 320/128 |
| 6,078,163 A | 6/2000 | Horie et al. | |
| 6,211,652 B1 | 4/2001 | Glasgow | |
| 6,259,229 B1 * | 7/2001 | Ashtiani et al. | 320/128 |
| 6,340,879 B1 | 1/2002 | Bläcker | |
| 6,771,518 B2 * | 8/2004 | Orr et al. | 363/16 |
| 6,882,061 B1 | 4/2005 | Ashtiani et al. | |
| 7,292,010 B2 | 11/2007 | Hsu et al. | |
| 7,382,102 B2 | 6/2008 | Ashtiani | |
| 7,402,982 B2 | 7/2008 | Ito et al. | |
| 7,876,583 B2 | 1/2011 | Polivka et al. | |
| 8,004,866 B2 * | 8/2011 | Bucella et al. | 363/50 |
| 8,197,502 B2 * | 6/2012 | Smith et al. | 606/169 |
| 8,493,036 B2 | 7/2013 | Ferrario | |
| 2005/0077879 A1* | 4/2005 | Near | 320/166 |
| 2005/0156578 A1 | 7/2005 | Karmenoff | |
| 2005/0168195 A1 | 8/2005 | MacDougall | |
| 2005/0264237 A1 | 12/2005 | Ishizuka | |
| 2007/0024243 A1 | 2/2007 | Liu et al. | |
| 2007/0121258 A1 | 5/2007 | Hachiya | |
| 2009/0014436 A1 | 1/2009 | Toya et al. | |
| 2009/0243547 A1 | 10/2009 | Andelfinger | |
| 2011/0095711 A1 | 4/2011 | Hsieh et al. | |
| 2011/0144861 A1 | 6/2011 | Lakirovich et al. | |
| 2011/0273136 A1* | 11/2011 | Yoshimoto | 320/103 |
| 2012/0024838 A1 | 2/2012 | Xu et al. | |
| 2012/0025754 A1 | 2/2012 | Xu et al. | |
| 2012/0025755 A1 | 2/2012 | Xu et al. | |
| 2012/0025756 A1 | 2/2012 | Xu et al. | |
| 2012/0025772 A1 | 2/2012 | Xu et al. | |
| 2012/0025774 A1 | 2/2012 | Xu et al. | |
| 2012/0025775 A1 | 2/2012 | Xu et al. | |
| 2012/0025776 A1 | 2/2012 | Xu et al. | |
| 2012/0025777 A1 | 2/2012 | Xu et al. | |
| 2012/0025778 A1 | 2/2012 | Xu et al. | |
| 2012/0025779 A1 | 2/2012 | Xu et al. | |
| 2012/0025781 A1 | 2/2012 | Xu et al. | |
| 2012/0025782 A1 | 2/2012 | Xu et al. | |
| 2012/0025783 A1 | 2/2012 | Xu et al. | |
| 2012/0031890 A1 | 2/2012 | Han et al. | |
| 2012/0032642 A1 | 2/2012 | Xu et al. | |
| 2012/0126753 A1 | 5/2012 | Carkner | |
| 2012/0161711 A1 | 6/2012 | Xu et al. | |
| 2012/0279951 A1 | 11/2012 | Xu et al. | |
| 2012/0280658 A1 | 11/2012 | Xu et al. | |
| 2012/0280659 A1 | 11/2012 | Xu et al. | |
| 2012/0299551 A1 | 11/2012 | Xu et al. | |
| 2012/0306432 A1 | 12/2012 | Xu et al. | |
| 2013/0127398 A1 | 5/2013 | Xu et al. | |
| 2013/0134146 A1 | 5/2013 | Han et al. | |
| 2013/0134945 A1 | 5/2013 | Xu et al. | |
| 2013/0141032 A1 | 6/2013 | Xu et al. | |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 U | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

European Patent Office, Extended European Search Report dated Nov. 30, 2011, in related application EP 11166938.8.

European Patent Office, Extended European Search Report dated Dec. 15, 2011, in related application EP 11166941.2.

European Patent Office, Extended European Search Report dated Sep. 16, 2011, in related application EP 11166949.5.

European Patent Office, Extended European Search Report dated Oct. 6, 2011, in related application EP 11166925.5.

European Patent Office, European Search Report dated Sep. 29, 2011, in related application EP 11166958.6.

European Patent Office, Extended European Search Report dated Jan. 25, 2012, in related application EP 11166952.9.

European Patent Office, European Search Report dated Sep. 21, 2011, in related application EP 11166969.3.

European Patent Office, European Search Report dated Sep. 1, 2011, in related application EP 11166903.2.

(56) References Cited

OTHER PUBLICATIONS

European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.
Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related U.S. Appl. No. 13/166,281.
United States Patent and Trademark Office, Office Action mailed May 31, 2013, in related U.S. Appl. No. 13/168,004.
United States Patent and Trademark Office, Office Action mailed May 22, 2013, in related U.S. Appl. No. 13/168,014.
United States Patent and Trademark Office, Office Action mailed Jul. 5, 2013, in related U.S. Appl. No. 13/170,021.
United States Patent and Trademark Office, Office Action mailed Jul. 30, 2013, in related U.S. Appl. No. 13/166,301.
United States Patent and Trademark Office, Office Action mailed Sep. 5, 2013, in related U.S. Appl. No. 13/189,096.
United States Patent and Trademark Office, Office Action mailed Aug. 29, 2013, in related U.S. Appl. No. 13/187,874.
United States Patent and Trademark Office, Office Action mailed Aug. 29, 2013, in related U.S. Appl. No. 13/189,114.
United States Patent and Trademark Office, Office Action mailed Sep. 30, 2013, in related U.S. Appl. No. 13/170,044.
United States Patent and Trademark Office, Office Action mailed Jun. 19, 2013, in related U.S. Appl. No. 13/187,890.
Taiwan Intellectual Property Office, Office Action dated Jan. 10, 2014, in related application TW 100143128.
Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.
United States Patent and Trademark Office, Notice of Allowance mailed Dec. 5, 2013, in related U.S. Appl. No. 13/166,281.
United States Patent and Trademark Office, Notice of Allowance mailed Nov. 8, 2013, in related U.S. Appl. No. 13/166,301.
United States Patent and Trademark Office, Notice of Allowance mailed Jan. 6, 2014, in related U.S. Appl. No. 13/189,096.
United States Patent and Trademark Office, Notice of Allowance mailed Jan. 6, 2014, in related U.S. Appl. No. 13/187,874.
United States Patent and Trademark Office, Office Action mailed Nov. 20, 2013, in related U.S. Appl. No. 13/168,004.
United States Patent and Trademark Office, Office Action mailed Nov. 22, 2013, in related U.S. Appl. No. 13/168,014.
United States Patent and Trademark Office, Final Office Action mailed Feb. 25, 2014, in related U.S. Appl. No. 13/170,021.
United States Patent and Trademark Office, Office Action mailed Jan. 6, 2014, in related U.S. Appl. No. 13/187,266.
United States Patent and Trademark Office, Office Action mailed Jan. 2, 2014, in related U.S. Appl. No. 13/189,114.
United States Patent and Trademark Office, Office Action mailed Dec. 3, 2013, in related U.S. Appl. No. 13/187,279.
United States Patent and Trademark Office, Office Action mailed Dec. 4, 2013, in related U.S. Appl. No. 13/187,890.
United States Patent and Trademark Office, Office Action mailed Jan. 6, 2014, in related U.S. Appl. No. 13/541,487.
United States Patent and Trademark Office, Office Action mailed Dec. 4, 2013, in related U.S. Appl. No. 13/748,525.
United States Patent and Trademark Office, Office Action mailed Jan. 15, 2014, in related U.S. Appl. No. 13/749,480.
United States Patent and Trademark Office, Office Action mailed Jun. 10, 2014, in related U.S. Appl. No. 13/168,004.
United States Patent and Trademark Office, Office Action mailed Jun. 18, 2014, in related U.S. Appl. No. 13/168,014.

(56) References Cited

OTHER PUBLICATIONS

United States Patent and Trademark Office, Office Action mailed Jun. 16, 2014, in related U.S. Appl. No. 13/184,879.
United States Patent and Trademark Office, Office Action mailed Jun. 20, 2014, in related U.S. Appl. No. 13/184,894.
United States Patent and Trademark Office, Office Action mailed Jun. 25, 2014, in related U.S. Appl. No. 13/187,266.
United States Patent and Trademark Office, Office Action mailed Jun. 17, 2014, in related U.S. Appl. No. 13/185,744.
United States Patent and Trademark Office, Office Action mailed Jun. 16, 2014, in related U.S. Appl. No. 13/184,915.
United States Patent and Trademark Office, Office Action mailed Jun. 24, 2014, in related U.S. Appl. No. 13/187,279.
United States Patent and Trademark Office, Office Action mailed Jun. 13, 2014, in related U.S. Appl. No. 13/185,756.
United States Patent and Trademark Office, Office Action mailed Jul. 7, 2014, in related U.S. Appl. No. 13/187,890.
United States Patent and Trademark Office, Office Action mailed Jun. 25, 2014, in related U.S. Appl. No. 13/541,487.
United States Patent and Trademark Office, Office Action mailed Jun. 26, 2014, in related U.S. Appl. No. 13/748,525.
United States Patent and Trademark Office, Office Action mailed Jun. 24, 2014, in related U.S. Appl. No. 13/749,480.
United States Patent and Trademark Office, Notice of Allowance mailed Apr. 25, 2014, in related U.S. Appl. No. 13/166,281.
United States Patent and Trademark Office, Notice of Allowance mailed Jun. 24, 2014, in related U.S. Appl. No. 13/170,021.
United States Patent and Trademark Office, Notice of Allowance mailed May 2, 2014, in related U.S. Appl. No. 13/166,301.
United States Patent and Trademark Office, Notice of Allowance mailed Jun. 18, 2014, in related U.S. Appl. No. 13/189,096.
United States Patent and Trademark Office, Notice of Allowance mailed May 8, 2014, in related U.S. Appl. No. 13/187,874.
United States Patent and Trademark Office, Notice of Allowance mailed Apr. 28, 2014, in related U.S. Appl. No. 13/189,114.
United States Patent and Trademark Office, Notice of Allowance mailed May 22, 2014, in related U.S. Appl. No. 13/170,044.
United States Patent and Trademark Office, Office Action mailed Sep. 26, 2014, in related U.S. Appl. No. 13/544,881.
United States Patent and Trademark Office, Office Action mailed Sep. 3, 2014, in related U.S. Appl. No. 13/486,883.
United States Patent and Trademark Office, Office Action mailed Sep. 11, 2014, in related U.S. Appl. No. 13/465,906.
United States Patent and Trademark Office, Office Action mailed Sep. 11, 2014, in related U.S. Appl. No. 13/545,885.
United States Patent and Trademark Office, Notice of Allowance mailed Oct. 6, 2014, in related U.S. Appl. No. 13/168,014.
United States Patent and Trademark Office, Notice of Allowance mailed Oct. 6, 2014, in related U.S. Appl. No. 13/187,279.
United States Patent and Trademark Office, Notice of Allowance mailed Oct. 3, 2014, in related U.S. Appl. No. 13/187,890.
United States Patent and Trademark Office, Notice of Allowance mailed Oct. 7, 2014, in related U.S. Appl. No. 13/541,487.
United States Patent and Trademark Office, Notice of Allowance mailed Oct. 6, 2014, in related U.S. Appl. No. 13/748,525.
United States Patent and Trademark Office, Notice of Allowance mailed Oct. 6, 2014, in related U.S. Appl. No. 13/749,480.
United States Patent and Trademark Office, Office Action mailed Nov. 13, 2014, in related U.S. Appl. No. 13/168,004.
United States Patent and Trademark Office, Office Action mailed Nov. 17, 2014, in related U.S. Appl. No. 13/187,266.

* cited by examiner

HEATING CIRCUITS AND METHODS BASED ON BATTERY DISCHARGING AND CHARGING USING RESONANCE COMPONENTS IN SERIES AND FREEWHEELING CIRCUIT COMPONENTS

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201010603719.6, filed Dec. 23, 2010, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

According to one embodiment, the battery heating circuit provided in the present invention comprises a switch unit, a switching control module, a damping component R1, an energy storage circuit, and a freewheeling circuit, wherein: the energy storage circuit is connected with the battery, and comprises a current storage component L1 and a charge storage component C1; the damping component R1, switch unit, current storage component L1, and charge storage component C1 are connected in series; the switching control module is connected with the switch unit, and is configured to control ON/OFF of the switch unit, so that the energy can flow back-and-forth between the battery and the energy storage circuit when the switch unit switches on, and the amplitude of the current flowing from the energy storage circuit to the battery can be controlled; the freewheeling circuit is configured to sustain the current flowing to the battery when there is current flowing from the energy storage circuit to the battery and after the switch unit switches off.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Figure 1:
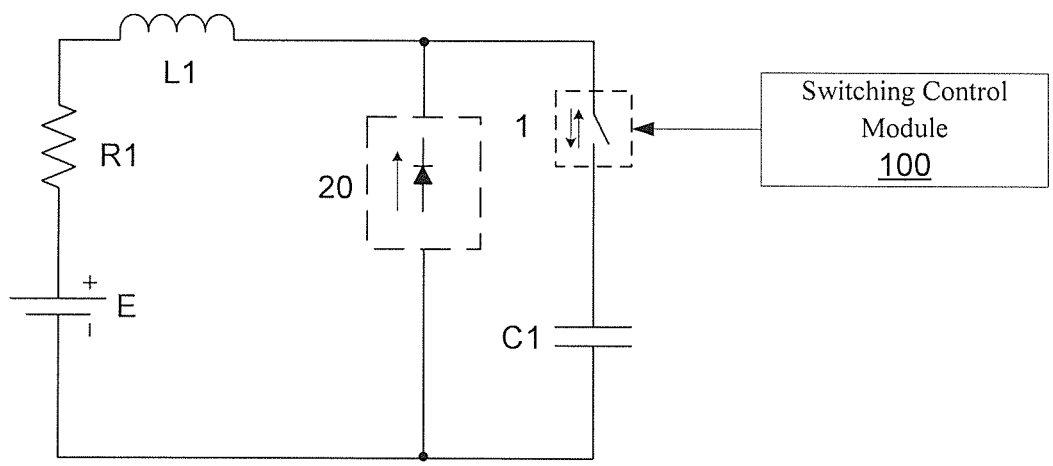
FIG. 1 is a schematic diagram of the battery heating circuit provided in one embodiment of the present invention.

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

In order to heat up the battery E located in the low temperature environment, one embodiment of the present invention provides a battery heating circuit; as shown in FIG. 1, the battery heating circuit comprises a switch unit 1, a switching control module 100, a damping component R1, an energy storage circuit, and a freewheeling circuit 20, wherein: the energy storage circuit is connected with the battery, and comprises a current storage component L1 and a charge storage component C1; the damping component R1, switch unit 1, current storage component L1, and charge storage component C1 are connected in series; the switching control module 100 is connected with the switch unit 1, and is configured to control ON/OFF of the switch unit 1, so that the energy can flow back-and-forth between the battery and the energy storage circuit when the switch unit 1 switches on, and the amplitude of the current flowing from the energy storage circuit to the battery can be controlled; the freewheeling circuit 20 is configured to sustain the current flowing to the battery when there is current flowing from the energy storage circuit to the battery and after the switch unit 1 switches off.

It should be noted specially that in view different types of batteries have different characteristics, in one embodiment of the present invention, if the battery E has very high internal parasitic resistance and parasitic inductance, the damping component R1 could refers to the parasitic resistance in the battery pack; likewise, the current storage component L2 could refers to the parasitic inductance in the battery pack.

The switch unit 1 is connected in series with the energy storage circuit; when the switch unit 1 switches on, the energy can flows back-and-forth between the battery E and the energy storage circuit; the switch unit 1 can be implemented in a variety of ways, and certain embodiments of the present invention do not impose any limitation to the implementation of the switch unit. The switch unit 1 may comprise a first one-way branch configured to implement energy flowing from the battery to the energy storage circuit, a second one-way branch configured to implement energy flowing from the energy storage circuit to the battery; the switching control module 100 is connected with the first one-way branch and second one-way branch respectively, so as to control ON/OFF of the connected branches.

Figure 2:
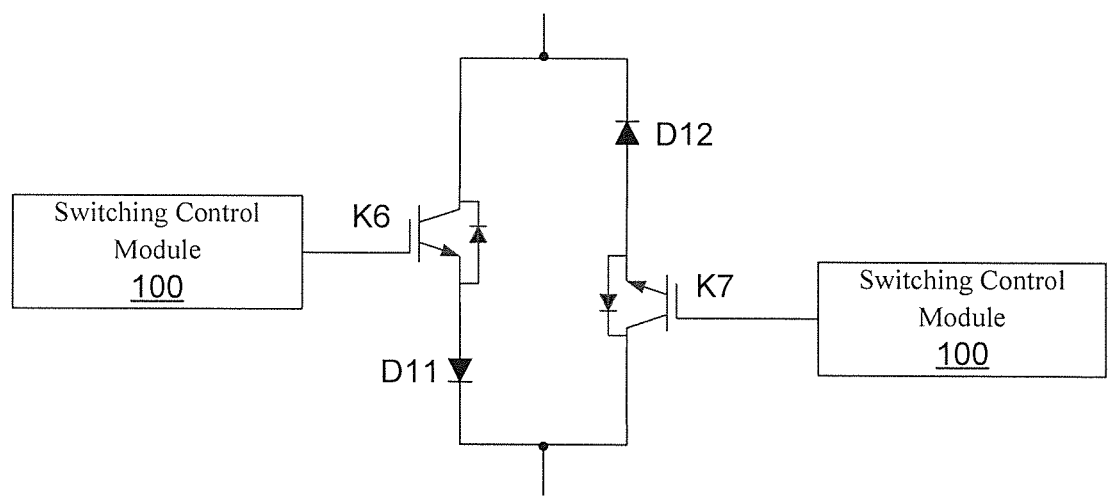
FIG. 2 is a schematic diagram of one embodiment of the switch unit shown in FIG. 1.

In one embodiment of switch unit 1, as shown in FIG. 2, the switch unit 1 may comprise a switch K6, switch K7, a one-way semiconductor component D11, and a one-way semiconductor component D12, wherein: the switch K6 and the one-way semiconductor component D11 are connected in series with each other to form the first one-way branch, the switch K7 and the one-way semiconductor component D12 are connected in series with each other to form the second one-way branch; the switching control module 100 is connected with the switch K6 and the switch k7, to control ON/OFF of the first one-way branch and the second one-way branch by controlling ON/OFF of the switch K6 and the switch k7. Thus, in the switch unit 1 shown in FIG. 2, since there are switches (i.e., switch K6 and switch K7) in both one-way branches, energy flow cut-off function in forward direction and reverse direction is enabled simultaneously.

Figure 3:
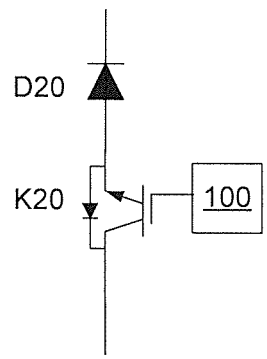
FIG. 3 is a schematic diagram of one embodiment of the freewheeling circuit shown in FIG. 1.

Due to the existence of inductance in the circuit, high induced electromotive force may be generated in the current storage component (e.g., current storage component L1) in the loop due to sudden current change when the switch unit switches off if there is current flowing from the energy storage circuit to the battery, and therefore other circuit components (e.g., switch unit 1) in the loop may be damaged. Since the heating circuit for battery E provided in one embodiment of the present invention provides a freewheeling circuit 20, the freewheeling circuit 20 will sustain the current flowing after the switch unit 1 switches off if there is current flowing from the energy storage circuit to the battery E, so as to protect other circuit components in the circuit. As shown in FIG. 3, the freewheeling circuit 20 can comprise a switch K20 and a one-way semiconductor component D20 connected in series with each other; the switching control module 100 is connected with the switch K20, and is configured to control the switch K20 to switch on after the switch unit 1 switches off if there is current flowing from the energy storage circuit to the battery, and control the switch K20 to switch off when the current flowing from the energy storage circuit to the battery reaches a predetermined current value (e.g., zero). The freewheeling circuit 20 can be connected in parallel between the ends of the battery E; or, one end of the freewheeling circuit 20 can be connected between the switch K7 and the one-way semiconductor component D12 in the second one-way branch of the switch unit 1, and the other end of the freewheeling circuit 20 can be connected to the battery, as shown in FIG. 2.

In the technical scheme of certain embodiments of the present invention, when the battery E is to be heated up, the switching control module 100 controls the switch unit 1 to switch on, and thereby the battery E and the energy storage circuits are connected in series to form a loop, and the battery E charges the charge storage component C1; when the current in the loop reaches zero in forward direction after the peak current, the charge storage component C1 begins discharging, and therefore the current flows from the charge storage component C1 back to the battery E; since both the current flowing in forward direction and the current flowing in reverse direction in the circuit flow though the damping component R1, the purpose of heating up the battery E is attained by using the heat generation in the damping component R1. Above charge/discharge process is carried out cyclically. When the temperature of the battery E rises to the heating stop condition, the switching control module 100 can control the switch unit 1 to switch off, and thereby the heating circuit will stop operation.

In the heating process described above, when the current flows from the energy storage circuit back to the battery E, the energy in the charge storage component C1 will not flow back to the battery E completely; instead, some energy will remain in the charge storage component C1, and ultimately the voltage across the charge storage component C1 is close or equal to the voltage of the battery, and therefore the energy flow from the battery E to the charge storage component C1 cannot continue anymore; that phenomenon is adverse to the cyclic operation of the heating circuit. Therefore, in one embodiment of the present invention, an additional unit that implements the functions such as superposing the energy in the charge storage component C1 with the energy in the battery E, or transferring the energy in the charge storage component C1 to another energy storage component is added. At an appropriate time, the switch unit 1 is controlled to switch off, and the energy in the charge storage component C1 is superposed or transferred, for example. The switch unit 1 can be controlled to switch off at any time in one or more cycles; the switch unit 1 can be controlled to switch off at any time, for example, when the current flowing in the circuit is in forward direction/reverse direction, and when the current flowing is zero or not zero. Preferably, the switching control module 100 is configured to control the switch unit 1 to switch off when the current flowing though the switch unit 1 is zero after the switch unit 1 switches on, so as to improve the working efficiency of the circuit. In addition, the disturbance to the entire circuit is minimal if the switch unit 1 switches off when the current flowing in the circuit is zero. To implement current freewheeling repeatedly, the switch unit 1 can switch off before the current flowing in reverse direction is zero; in that case, the heating circuit for battery E provided in some embodiments of the present invention will not be disturbed severely, owing to the existence of the freewheeling circuit 20.

Figure 4:
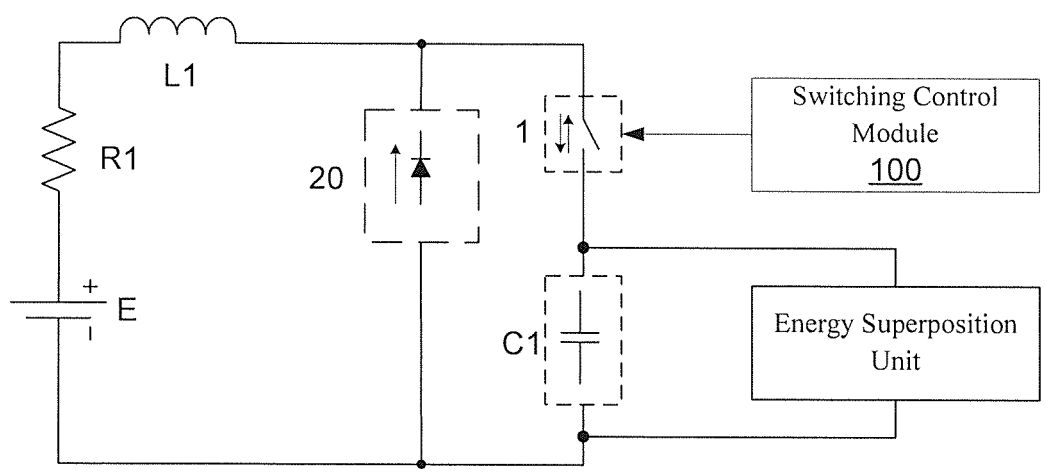
FIG. 4 is a schematic diagram of one embodiment of the battery heating circuit provided in the present invention.

To improve heating efficiency, in one embodiment of the present invention, as shown in FIG. 4, the heating circuit provided in one embodiment of the present invention can comprise an energy superposition unit, which is connected with the energy storage circuit, and is configured to superpose the energy in the energy storage circuit with the energy in the battery E after the switch unit 1 switches on and then switches off. With the energy superposition unit, the discharging current in the heating loop can be increased when the switch unit 1 switches on again, and thereby the working efficiency of the heating circuit is improved.

Figure 5:
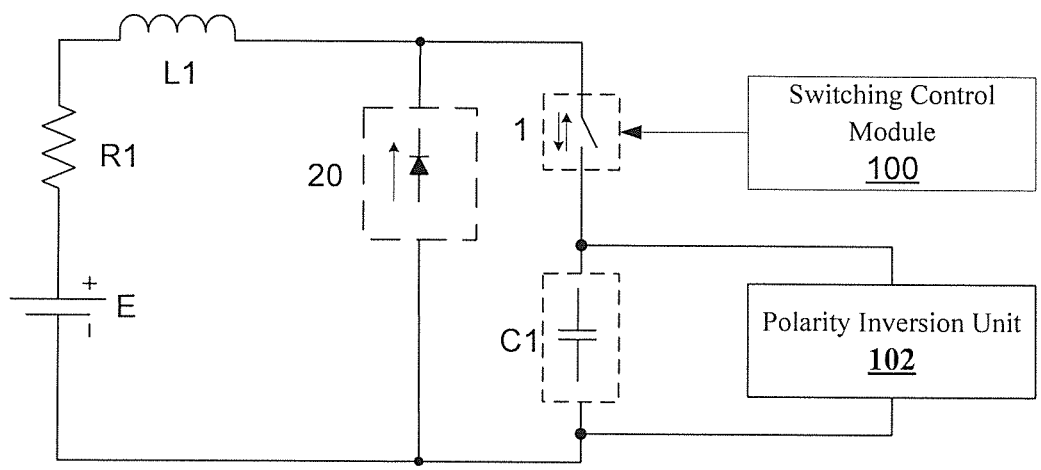
FIG. 5 is a schematic diagram of one embodiment of the energy superposition unit shown in FIG. 4.

In one embodiment of the present invention, as shown in FIG. 5, the energy superposition unit comprises a polarity inversion unit 102, which is connected with the energy storage circuit, and is configured to invert the voltage polarity of the charge storage component C1 after the switch unit 1 switches on and then switches off. Since the voltage of the charge storage component C1 can be superposed in series with the voltage of the battery E after polarity inversion, the discharging current in the heating loop will be increased when the switch unit 1 switches on again.

Figure 6:
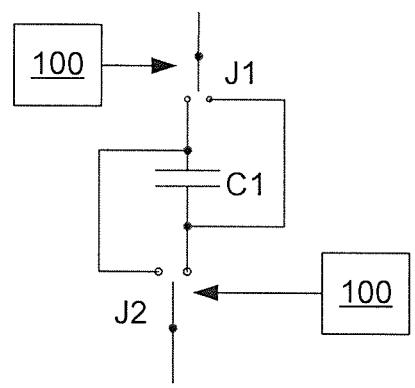
FIG. 6 is a schematic diagram of one embodiment of the polarity inversion unit shown in FIG. 5.

As one embodiment of the polarity inversion unit 102, as shown in FIG. 6, the polarity inversion unit 102 comprises a single-pole double-throw switch J1 and a single-pole double-throw switch J2 located on the two ends of the charge storage component C1 respectively; the input wires of the single-pole double-throw switch J1 are connected in the energy storage circuit, the first output wire of the single-pole double-throw switch J1 is connected with the first pole plate of the charge storage component C1, and the second output wire of the single-pole double-throw switch J1 is connected with the second pole plate of the charge storage component C1; the input wires of the single-pole double-throw switch J2 are connected in the energy storage circuit, the first output wire of the single-pole double-throw switch J2 is connected with the second pole plate of the charge storage component C1, and the second output wire of the single-pole double-throw switch J2 is connected with the first pole plate of the charge storage component C1; the switching control module 100 is also connected with the single-pole double-throw switch J1 and single-pole double-throw switch J2 respectively, and is configured to invert the voltage polarity of the charge storage component C1 by altering the connection relationships between the respective input wires and output wires of the single-pole double-throw switch J1 and the single-pole double-throw switch J2.

According to this embodiment, the connection relationships between the respective input wires and output wires of the single-pole double-throw switch J1 and single-pole double-throw switch J2 can be set in advance, so that the input wires of the single-pole double-throw switch J1 are connected with the first output wire of the switch unit K1 and the input wires of the single-pole double-throw switch J2 are connected with the first output wire of the switch unit K1 when the switch unit K1 switches on; the input wires of the single-pole double-throw switch J1 are switched to connect with the second output wire of the switch unit K1 and the input wires of the single-pole double-throw switch J2 are switched to connect with the second output wire of the switch unit K1 under control of the switching control module 100 when the switch unit K1 switches off, and thereby the voltage polarity of the charge storage component C1 is inverted.

Figure 7:
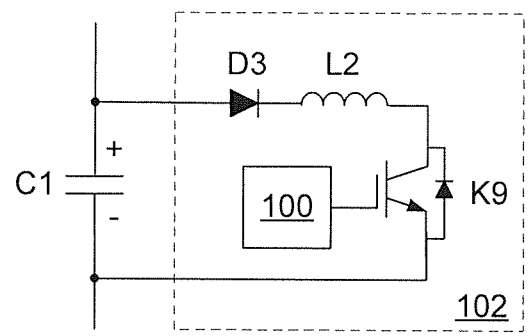
FIG. 7 is a schematic diagram of one embodiment of the polarity inversion unit shown in FIG. 5.

As another embodiment of the polarity inversion unit 102, as shown in FIG. 7, the polarity inversion unit 102 comprises a one-way semiconductor component D3, a current storage component L2, and a switch K9; the charge storage component C1, current storage component L2, and switch K9 are connected sequentially in series to form a loop; the one-way semiconductor component D3 is connected in series between the charge storage component C1 and the current storage component L2 or between the current storage component L2 and the switch K9; the switching control module 100 is also connected with the switch K9, and is configured to invert the voltage polarity of the charge storage component C1 by controlling the switch K9 to switch on.

According to the above embodiment, when the switch unit 1 switches off, the switch K9 can be controlled to switch on by the switching control module 100, and thereby the charge storage component C1, one-way semiconductor component D3, current storage component L2, and switch K9 form a LC oscillation loop, and the charge storage component C1 discharges through the current storage component L2, thus, the voltage polarity of the charge storage component C1 will be inverted when the current flowing through the current storage component L2 reaches zero after the current in the oscillation circuit flows through the positive half cycle.

Figure 8:
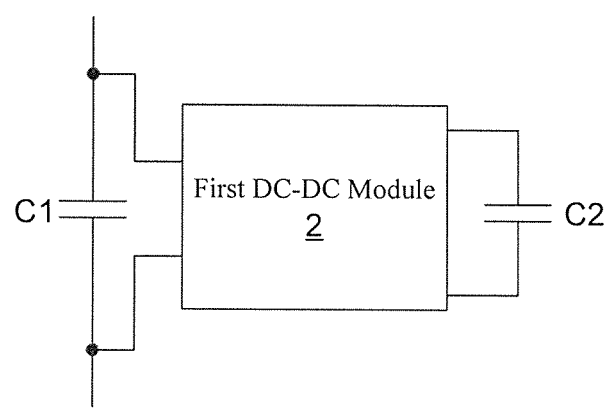
FIG. 8 is a schematic diagram of one embodiment of the polarity inversion unit shown in FIG. 5.

As yet another embodiment of the polarity inversion unit 102, as shown in FIG. 8, the polarity inversion unit 102 comprises a first DC-DC module 2 and a charge storage component C2; the first DC-DC module 2 is connected with the charge storage component C1 and the charge storage component C2 respectively; the switching control module 100 is also connected with the first DC-DC module 2, and is configured to transfer the energy in the charge storage component C1 to the charge storage component C2 by controlling the operation of the first DC-DC module 2, and then transfer the energy in the charge storage component C2 back to the charge storage component C1, so as to invert the voltage polarity of the charge storage component C1.

The first DC-DC module 2 is a DC-DC (direct current to direct current) conversion circuit for voltage polarity inversion commonly used in the field. Certain embodiments of the present invention do not impose any limitation to the specific circuit structure of the first DC-DC module 2, as long as the module can accomplish voltage polarity inversion of the charge storage component C1. Those skilled in the art can add, substitute, or delete the components in the circuit as needed.

Figure 9:
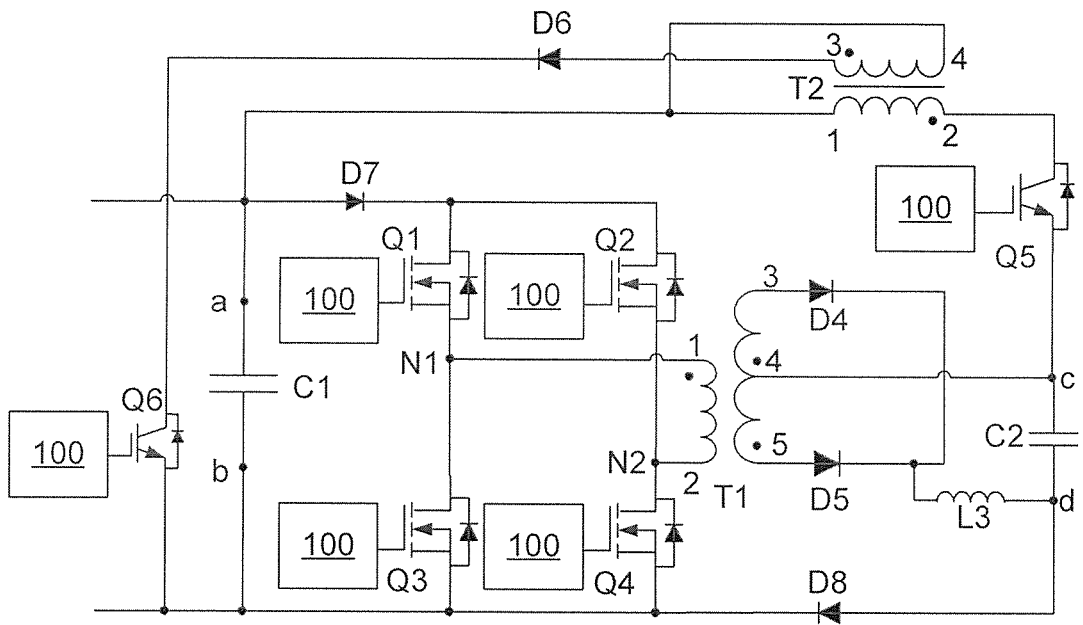
FIG. 9 is a schematic diagram of one embodiment of the first DC-DC module shown in FIG. 8.

FIG. 9 shows one embodiment of the first DC-DC module 2 provided in the present invention. As shown in FIG. 9, the first DC-DC module 2 comprises: a two-way switch Q1, a two-way switch Q2, a two-way switch Q3, a two-way switch Q4, a first transformer T1, a one-way semiconductor component D4, a one-way semiconductor component D5, a current storage component L3, a two-way switch Q5, a two-way switch Q6, a second transformer T2, a one-way semiconductor component D6, a one-way semiconductor component D7, and a one-way semiconductor component D8.

In the embodiment, the two-way switch Q1, two-way switch Q2, two-way switch Q3, and two-way switch Q4 are MOSFETs, and the two-way switch Q5 and two-way switch Q6 are IGBTs.

The Pin 1, 4, and 5 of the first transformer T1 are dotted terminals, and the pin 2 and 3 of the second transformer T2 are dotted terminals.

Wherein: the positive electrode of the one-way semiconductor component D7 is connected with the end 'a' of the charge storage component C1, and the negative electrode of the one-way semiconductor component D7 is connected with the drain electrodes of the two-way switch Q1 and two-way switch Q2, respectively; the source electrode of the two-way switch Q1 is connected with the drain electrode of the two-way switch Q3, and the source electrode of the two-way switch Q2 is connected with the drain electrode of the two-way switch Q4; the source electrodes of the two-way switch Q3 and two-way switch Q4 are connected with the end 'b' of the charge storage component C1 respectively. Thus, a full-bridge circuit is formed, here, the voltage polarity of end 'a' of the charge storage component C1 is positive, while the voltage polarity of end 'b' of the charge storage component C1 is negative.

In the full-bridge circuit, the two-way switch Q1, two-way switch Q2 constitute the upper bridge arm, while the two-way switch Q3 and two-way switch Q4 constitute the lower bridge arm. The full-bridge circuit is connected with the charge storage component C2 via the first transformer T1; the pin 1 of the first transformer T1 is connected with the first node N1, the pin 2 of the first transformer T1 is connected with the second node N2, the pin 3 and pin 5 of the first transformer T1 are connected to the positive electrode of the one-way semiconductor component D4 and the positive electrode of the one-way semiconductor component D5 respectively; the negative electrode of one-way semiconductor component D4 and the negative electrode of one-way semiconductor component D5 are connected with one end of the current storage component L3, and the other end of the current storage component L3 is connected with the end 'd' of the charge storage component C2; the pin 4 of the transformer T1 is connected with the end 'c' of the charge storage component C2, the positive electrode of the one-way semiconductor component D8 is connected with the end 'd' of the charge storage component C2, and the negative electrode of the one-way semiconductor component D8 is connected with the end 'b' of the charge storage component C1; here, the voltage polarity of end 'c' of the charge storage component C2 is negative, while the voltage polarity of end 'd' of the charge storage component C2 is positive.

Wherein: the end 'c' of the charge storage component C2 is connected with the emitter electrode of the two-way switch Q5, the collector electrode of the two-way switch Q5 is connected with the pin 2 of the transformer T2, the pin 1 of the transformer T2 is connected with end 'a' of the charge storage component C1, the pin 4 of the transformer T2 is connected with end 'a' of the charge storage component C1, the pin 3 of the transformer T2 is connected with the positive electrode of the one-way semiconductor component D6, the negative electrode of the one-way semiconductor component D6 is connected with the collector electrode of the two-way switch Q6, and the emitter electrode of the two-way switch Q6 is connected with the end 'b' of the charge storage component C2.

Wherein: the two-way switch Q1, two-way switch Q2, two-way switch Q3, two-way switch Q4, two-way switch Q5, and two-way switch Q6 are controlled by the switching control module 100 respectively to switch on and switch off.

Hereafter the working process of the first DC-DC module 2 will be described:

1. After the switch unit 1 switches off, the switching control module 100 controls the two-way switch Q5 and two-way switch Q6 to switch off, and controls the two-way switch Q1 and two-way switch Q4 to switch on at the same time to form phase A; controls the two-way switch Q2 and two-way switch Q3 to switch on at the same time to form phase B. Thus, by controlling the phase A and phase B to switch on alternately, a full-bridge circuit is formed;

2. When the full-bridge circuit operates, the energy in the charge storage component C1 is transferred through the first transformer T1, one-way semiconductor component D4, one-way semiconductor component D5, and current storage component L3 to the charge storage component C2; now, the voltage polarity of end 'c' of the charge storage component C2 is negative, while the voltage polarity of end 'd' of the charge storage component C2 is positive.

3. The switching control module 100 controls the two-way switch Q5 to switch on, and therefore a path from the charge storage component C1 to the charge storage component C2 is formed via the second transformer T2 and the one-way semiconductor component D8, thus, the energy in the charge storage component C2 is transferred back to the charge storage component C1, wherein: some energy will be stored in the second transformer T2, Now, the switching control module 100 controls the two-way switch Q5 to switch off and controls the two-way switch Q6 to switch on, and therefore the energy stored in the second transformer T2 is transferred to the charge storage component C1 by the second transformer T2 and the one-way semiconductor component D6; now, the voltage polarity of the charge storage component C1 is inverted such that end 'a' is negative and end 'b' is positive. Thus, the purpose of inverting the voltage polarity of the charge storage component C1 is attained.

Figure 10:
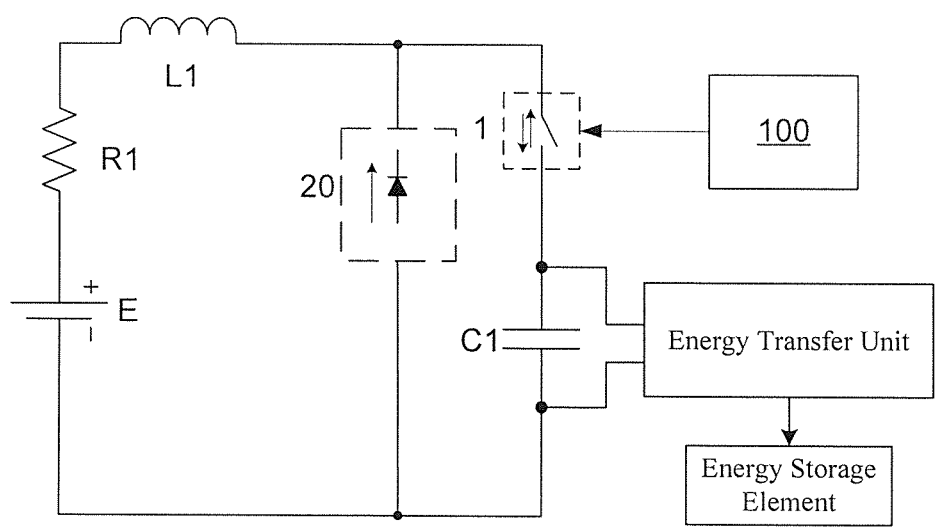
FIG. 10 is a schematic diagram of one embodiment of the battery heating circuit provided in the present invention.

To recycle the energy in the energy storage circuit, in one embodiment of the present invention, as shown in FIG. 10, the heating circuit may comprise an energy transfer unit, which is connected with the energy storage circuit, and is configured to transfer the energy in the energy storage circuit to the energy storage component after the switch unit 1 switches on and then switches off. The purpose of the energy transfer unit is to recycle the energy in the energy storage circuit. The energy storage component can be an external capacitor, a low temperature battery or electric network, or an electrical device.

Figure 11:
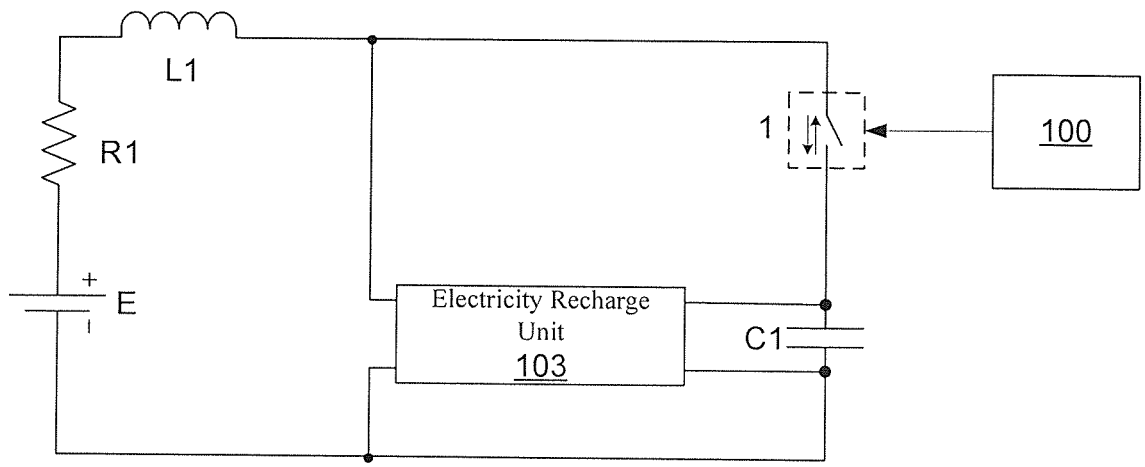
FIG. 11 is a schematic diagram of one embodiment of the battery heating circuit provided in the present invention.

Preferably, the energy storage component is the battery E provided in one embodiment of the present invention, the energy transfer unit comprises an electricity recharge unit 103, which is connected with the energy storage circuit, and is configured to transfer the energy in the energy storage circuit to the battery E after the switch unit 1 switches on and then switches off, as shown in FIG. 11.

In the technical solution of certain embodiments of the present invention, after the switch unit 1 switches off, the energy in the energy storage circuit is transferred by the energy transfer unit to the battery E, so that the transferred energy can be recycled after the switch unit 1 switches on again, and thereby the working efficiency of the heating circuit is improved.

Figure 12:
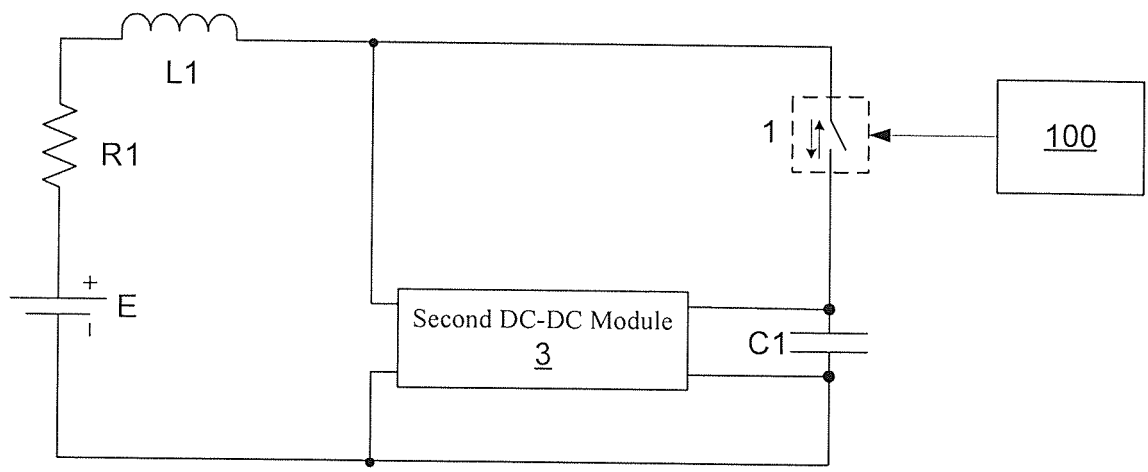
FIG. 12 is a schematic diagram of one embodiment of the electricity recharge unit shown in FIG. 11.

In one embodiment of the electricity recharge unit 103, as shown in FIG. 12, the electricity recharge unit 103 comprises a second DC-DC module 3, which is connected with the charge storage component C1 and the battery E respectively; the switching control module 100 is also connected with the second DC-DC module 3, and is configured to control the operation of the second DC-DC module 3, so as to transfer the energy in the charge storage component C1 to the battery E.

The second DC-DC module 3 is a DC-DC (direct current to direct current) conversion circuit for energy transfer commonly used in the field. Certain embodiments of the present invention do not impose any limitation to the specific circuit structure of the second DC-DC module 3, as long as the module can transfer the energy in the charge storage component C1. Those skilled in the art can add, substitute, or delete the components in the circuit as needed.

Figure 13:
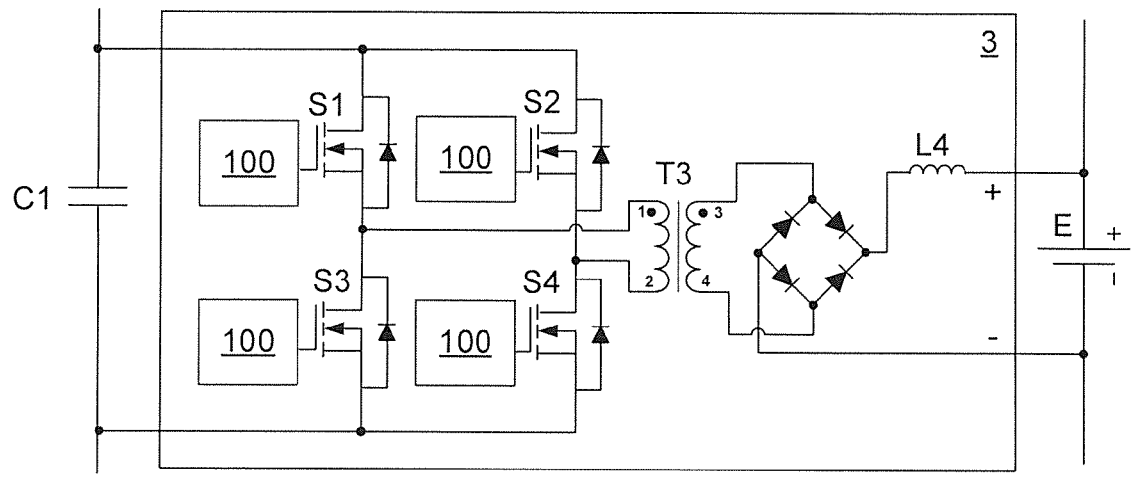
FIG. 13 is a schematic diagram of one embodiment of the second DC-DC module shown in FIG. 12.

FIG. 13 shows one embodiment of the second DC-DC module 3 provided in the present invention. As shown in FIG. 13, the second DC-DC module 3 comprises: a two-way switch S1, a two-way switch S2, a two-way switch S3, a two-way switch S4, a third transformer T3, a current storage component L4, and four one-way semiconductor components. In the embodiment, the two-way switch S1, two-way switch S2, two-way switch S3, and two-way switch S4 are MOSFETs.

Wherein: the pin 1 and pin 3 of the third transformer T3 are dotted terminals; the negative electrodes of two one-way semiconductor components among the four one-way semiconductor components are connected into a group and their junction point is connected with the positive pole of the battery E through the current storage component L4; the positive electrodes of the other two one-way semiconductor components are connected into a group and their junction point is connected with the negative pole of the battery E; in addition, the junction points between the groups are connected with pin 3 and pin 4 of the third transformer T3 respectively, and thereby form a bridge rectifier circuit.

Wherein: the source electrode of the two-way switch S1 is connected with the drain electrode of the two-way switch S3, the source electrode of the two-way switch S2 is connected with the drain electrode of the two-way switch S4, the drain electrodes of the two-way switch S1 and two-way switch S2 are connected with the positive end of the charge storage component C1 respectively, the source electrodes of the two-way switch S3 and two-way switch S4 are connected with the negative end of the charge storage component C1 respectively; thus, a full-bridge circuit is formed.

In the full-bridge circuit, the two-way switch S1 and two-way switch S2 constitute the upper bridge arm, and the two-way switch S3 and two-way switch S4 constitute the lower bridge arm; the pin 1 of the third transformer T3 is connected with the node between two-way switch S1 and two-way switch S3, and the pin 2 of the third transformer T3 is connected with the node between two-way switch S2 and two-way switch S4.

Wherein: the two-way switch S1, two-way switch S2, two-way switch S3, and two-way switch S4 are controlled by the switching control module 100 respectively to switch on and switch off.

Hereafter the working process of the second DC-DC module 3 will be described:

1. After the switch unit 1 switches off, the switching control module 100 controls the two-way switch S1 and two-way switch S4 to switch on at the same time to form phase A; and controls the two-way switch S2 and two-way switch S3 to switch on at the same time to form phase B. Thus, by controlling the phase A and phase B to switch on alternately, a full-bridge circuit is formed;

2. When the full-bridge circuit operates, the energy in charge storage component C1 is transferred to the battery E through the third transformer T3 and rectifier circuit; and the rectifier circuit converts the AC input into DC and outputs the DC to the battery E, to attain the purpose of electricity recharge.

Figure 14:
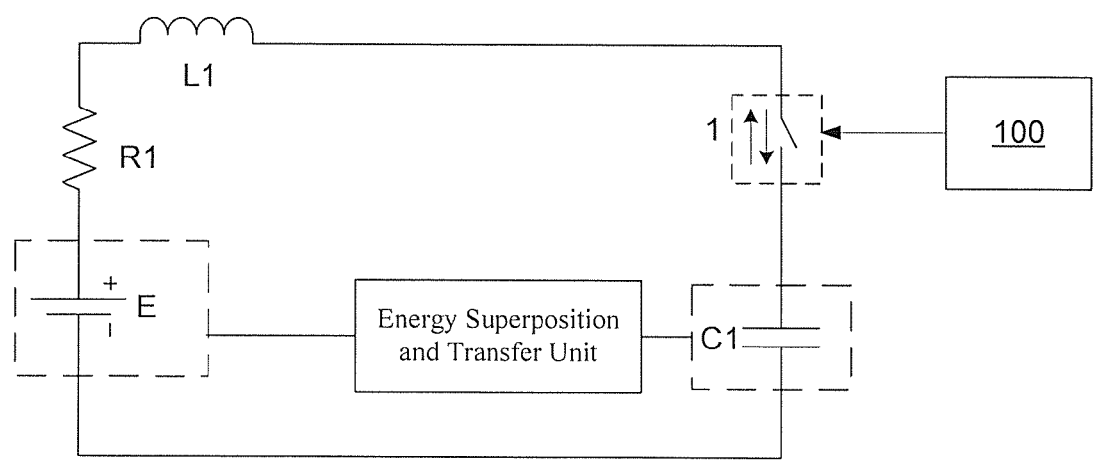
FIG. 14 is a schematic diagram of one embodiment of the battery heating circuit provided in the present invention.

In order to improve the working efficiency of the heating circuit while achieve energy recycling for the energy storage circuit, in one embodiment of the present application, as shown in FIG. 14, the heating circuit of the present application may comprises an energy superposition and transfer unit, the energy superposition and transfer unit is connected with the energy storage circuit, and is configured to transfer the energy in the energy storage circuit to an energy storage component after the switch unit 1 switches on and then switches off, and then superpose the remaining energy in the energy storage circuit with the energy in the battery E. Through energy transfer, energy recycling is achieved, and through energy superposition, the discharging current in the heating loop will be increased when the switch unit 1 switches on again, and thereby the working efficiency of the heating circuit can be improved.

The superposition of the remaining energy in the energy storage circuit with the energy in the battery can be implemented by inverting the voltage polarity of the charge storage component C1; after polarity inversion, the voltage across the charge storage component C1 can be added in series with the voltage of the battery E; thus, when the switch unit 1 switches on at the next time, the energy in the battery E can be superposed with the energy in the charge storage component C1.

Figure 15:
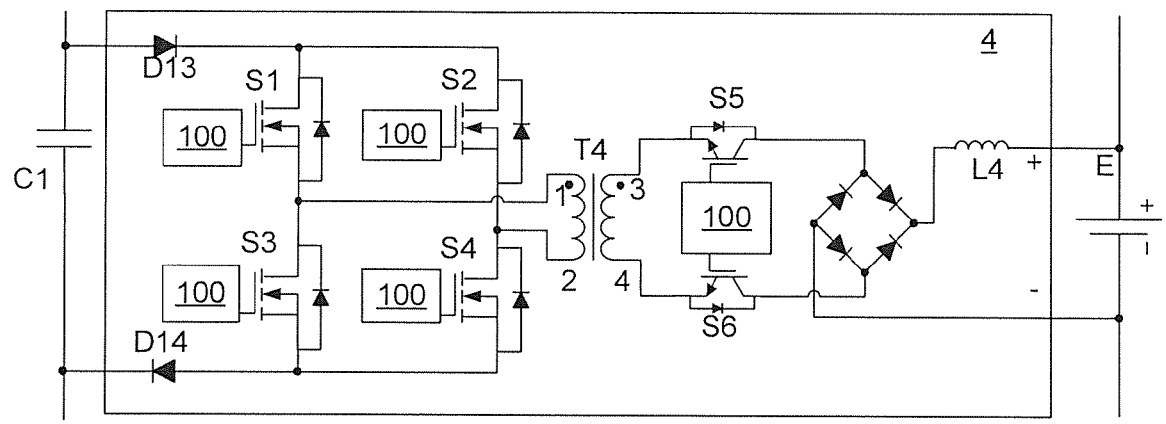
FIG. 15 is a schematic diagram of one embodiment of the energy superposition and transfer unit shown in FIG. 14.

Therefore, according to one embodiment of the present invention, as shown in FIG. 15, in the heating circuit, the energy superposition and transfer unit comprises a DC-DC module 4, which is connected with the charge storage component C1 and the battery E respectively; the switching control module 100 is also connected with the DC-DC module 4, and is configured to transfer the energy in the charge storage component C1 to an energy storage component by controlling the operation of the DC-DC module 4, and then superpose the remaining energy in the charge storage component C1 with the energy in the battery E. In that embodiment, the energy storage component is the battery E.

The DC-DC module 4 is a DC-DC (direct current to direct current) conversion circuit for energy transfer and voltage polarity inversion commonly used in the field. Certain embodiments of the present invention do not impose any limitation to the specific circuit structure of the DC-DC module 4, as long as the module can accomplish energy transfer from the charge storage component C1 and voltage polarity inversion of the charge storage component C1. Those skilled in the art can add, substitute, or delete the components in the circuit as needed.

In one embodiment of the DC-DC module 4, as shown in FIG. 15, the DC-DC module 4 comprises: a two-way switch S1, a two-way switch S2, a two-way switch S3, a two-way switch S4, a two-way switch S5, a two-way switch S6, a fourth transformer T4, a one-way semiconductor component D13, a one-way semiconductor component D14, a current storage component L4, and four one-way semiconductor components. In that embodiment, the two-way switch S1, two-way switch S2, two-way switch S3, and two-way switch S4 are MOSFETs, while the two-way switch S5 and two-way switch S6 are IGBTs.

Wherein: the pin 1 and pin 3 of the fourth transformer T3 are dotted terminals; the negative electrodes of two one-way semiconductor components among the four one-way semiconductor components are connected into a group and their junction point is connected with the positive pole of the battery E through the current storage component L4; the positive electrodes of the other two one-way semiconductor components are connected into a group and their junction point is connected with the negative pole of the battery E; in addition, the junction points between the groups are connected with pin 3 and pin 4 of the third transformer T3 via two-way switch S5 and two-way switch S6 respectively, and thereby form a bridge rectifier circuit.

Wherein: the source electrode of the two-way switch S1 is connected with the drain electrode of the two-way switch S3, the source electrode of the two-way switch S2 is connected with the drain electrode of the two-way switch S4, the drain electrodes of the two-way switch S1 and two-way switch S2 are connected with the positive end of the charge storage component C1 via the one-way semiconductor component D13, the source electrodes of the two-way switch S3 and two-way switch S4 are connected with the negative end of the charge storage component C1 via the one-way semiconductor component D14; thus, a full-bridge circuit is formed.

In the full-bridge circuit, the two-way switch S1 and two-way switch S2 constitute the upper bridge arm, and the two-way switch S3 and two-way switch S4 constitute the lower bridge arm; the pin 1 of the fourth transformer T4 is connected with the node between two-way switch S1 and two-way switch S3, and the pin 2 of the fourth transformer T4 is connected with the node between two-way switch S2 and two-way switch S4.

Wherein: the two-way switch S1, two-way switch S2, two-way switch S3, and two-way switch S4, two-way switch S5, and two-way switch S6 are controlled by the switching control module 100 respectively to switch on and switch off.

Hereafter the working process of the DC-DC module 4 will be described:

1. After the switch unit 1 switches off, when electricity recharging is to be performed from the charge storage component C1 (i.e., transferring the energy from the charge storage component C1 back to the battery E) so as to accomplish energy transfer, the switching control module 100 controls the two-way switch S5 and S6 to switch on, and controls the two-way switch S1 and two-way switch S4 to switch on at the same time, to constitute phase A; the switching control module 100 controls the two-way switch S2 and two-way switch S3 to switch on at the same time, to constitute phase B. Thus, by controlling the phase A and phase B to switch on alternately, a full-bridge circuit is formed;

2. When the full-bridge circuit operates, the energy in charge storage component C1 is transferred to the battery E through the fourth transformer T4 and rectifier circuit; the rectifier circuit converts the AC input into DC and outputs the DC to the battery E, to attain the purpose of electricity recharging;

3. When polarity inversion of the charge storage component C1 is to be performed to accomplish energy superposition, the switching control module 100 controls the two-way switch S5 and two-way switch S6 to switch off, and controls either of the two groups (two-way switch S1 and two-way switch S4, or two-way switch S2 and two-way switch S3) to switch on; now, the energy in the charge storage component C1 flows through the positive end of charge storage component C1, two-way switch S1, primary side of the fourth transformer T4, and two-way switch S4 back to the negative end of the charge storage component C1, or flows through the positive end of charge storage component C1, two-way switch S2, primary side of the fourth transformer T4, and two-way switch S3 back to the negative end of the charge storage component C1. Thus, the purpose of voltage polarity inversion of charge storage component C1 is attained by using the magnetizing inductance at the primary side of T4.

In another embodiment, in the heating circuit provided in the present invention, the energy superposition and transfer unit can comprise an energy superposition unit and an energy transfer unit, wherein: the energy transfer unit is connected with the energy storage circuit, and is configured to transfer the energy in the energy storage circuit to an energy storage component after the switch unit 1 switches on and then switches off; the energy superposition unit is connected with the energy storage circuit, and is configured to superpose the remaining energy in the energy storage circuit with the energy in the battery E after the energy transfer unit performs energy transfer.

Wherein: the energy superposition unit and the energy transfer unit can be the energy superposition unit and the energy transfer unit provided in the embodiments of the present invention described above, for the purpose of transferring and superposing the energy in the charge storage component C1. The structure and function of the energy superposition unit and the energy transfer unit will not be detailed further here.

Figure 16:
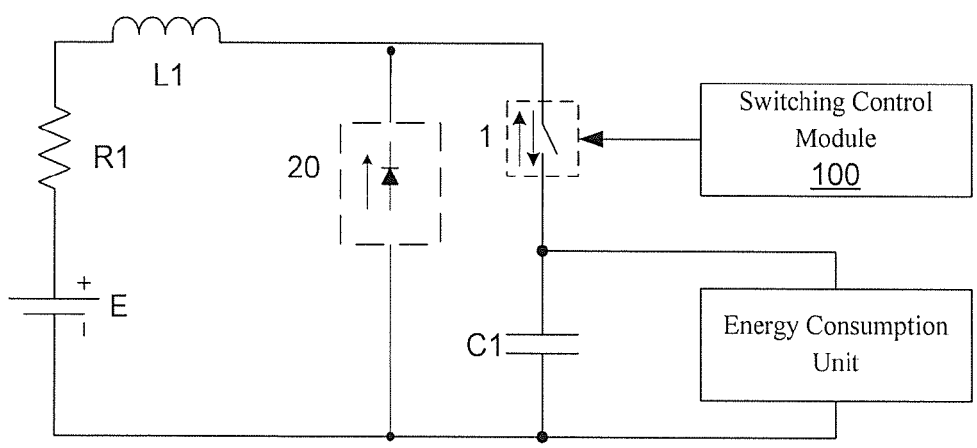
FIG. 16 is a schematic diagram of one embodiment of the battery heating circuit provided in the present invention.

In one embodiment of the present invention, the improvement of working efficiency of the heating circuit could be achieved by consuming the energy in the charge storage component C1. Thus, as shown in FIG. 16, the heating circuit further comprises an energy consumption unit, which is connected with the charge storage component C1, and is configured to consume the energy in the charge storage component C1 after the switch unit 1 switches on and then switches off.

The energy consumption unit can be used separately in the heating circuit, to consume the energy in the charge storage component C1 directly after the switch unit 1 switches on and then switches off; or, it can be integrated into the embodiments described above, for example, it can be integrated into the heating circuit that comprises an energy superposition unit, so as to consume the energy in the charge storage component C1 after the switch unit 1 switches on and then switches off and before the energy superposition unit performs energy superposition; or, it can be integrated into the heating circuit that comprises an energy transfer unit, so as to consume the energy in the charge storage component C1 after the switch unit 1 switches on and then switches off and before or after the energy transfer unit performs energy transfer; likewise, it can be integrated into the heating circuit that comprises an energy superposition and transfer unit, so as to consume the energy in the charge storage component C1 after the switch unit 1 switches on and then switches off and before the energy superposition and transfer unit performs energy transfer, or consume the energy in the charge storage component C1 after the switch unit 1 switches on and then switches off and after the energy superposition and transfer unit performs energy transfer and before the energy superposition and transfer unit performs energy superposition; certain embodiments of the present invention do not impose any limitation to the specific implementation of the energy consumption unit. Moreover, the working process of the energy consumption unit can be understood more clearly in the following embodiments.

Figure 17:
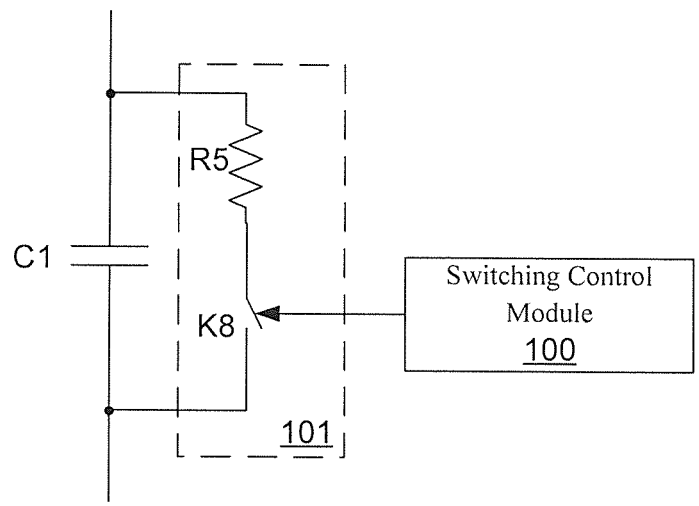
FIG. 17 is a schematic diagram of one embodiment of the energy consumption unit shown in FIG. 16.

In one embodiment, as shown in FIG. 17, the energy consumption unit comprises a voltage control unit 101, which is configured to convert the voltage across the charge storage component C1 to a predetermined value of voltage after the switch unit 1 switches on and then switches off. The predetermined value of voltage can be set as needed.

In one embodiment of the present invention, as shown in FIG. 17, the voltage control unit 101 comprises a damping component R5 and a switch K8, wherein: the damping component R5 and switch K8 are connected with each other in series, and then connected in parallel across the charge storage component C1; the switching control module 100 is also connected with the switch K8, and is configured to control the switch K8 to switch on after the switch unit 1 switches on and then switches off Thus, the energy in the charge storage component C1 can be consumed across the damping component R5.

Figure 18:
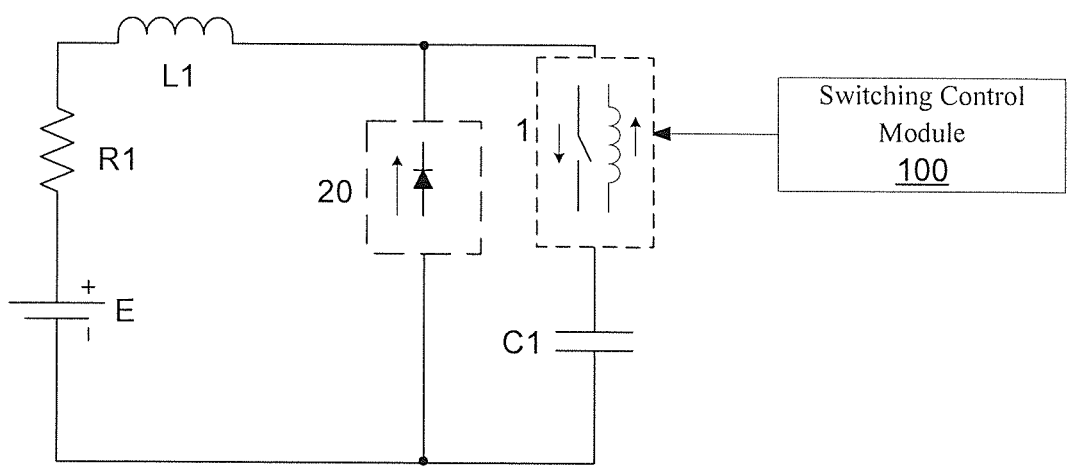
FIG. 18 is a schematic diagram of one embodiment of the battery heating circuit provided in the present invention.
Figure 19:
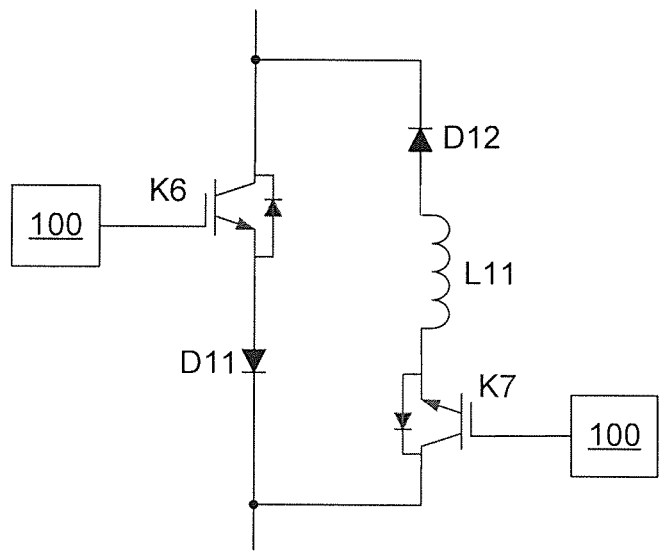
FIG. 19 is a schematic diagram of the connection relation of the energy limiting circuit in the heating circuit shown in FIG. 18.

In order to further limit the magnitude of current flowing to the battery E, preferably, as shown in FIG. 18, the heating circuit for battery E provided in one embodiment of the present invention further comprises an energy limiting circuit, which is configured to limit the magnitude of the current flowing from the energy storage circuit to the battery E; the energy limiting circuit can comprise a current storage component L11, which is connected in series in the second one-way branch of the switch unit 1 as shown in FIG. 2, specifically, the current storage component L11 can be connected in series between the one-way semiconductor component D12 and the switch K7 in the second one-way branch, as shown in FIG. 19. In such one embodiment, the current storage components in the heating circuit include not only the current storage component L1 but also the current storage component L11 for energy limitation; however, the current storage component L11 also has a problem of high induced electromotive force after the switch unit 1 switches off if the current in the circuit is not zero; in such a case, preferably, one end of the freewheeling circuit 20 is connected between the switch K7 and the current storage component L11 in the second one-way branch, and the other end of the freewheeling circuit 20 is connected to the negative electrode of the battery, so as to achieve current freewheeling function.

The switching control module 100 can be a separate controller, which, by using internal program setting, enables ON/OFF control of different external switches; or, the switching control module 100 can be a plurality of controllers, for example, a switching control module 100 can be set for each external switch correspondingly; or, the plurality of switching control modules 100 can be integrated into an assembly. Certain embodiments of the present invention do not impose any limitation to the forms of implementation of the switching control module 100.

Figure 20:
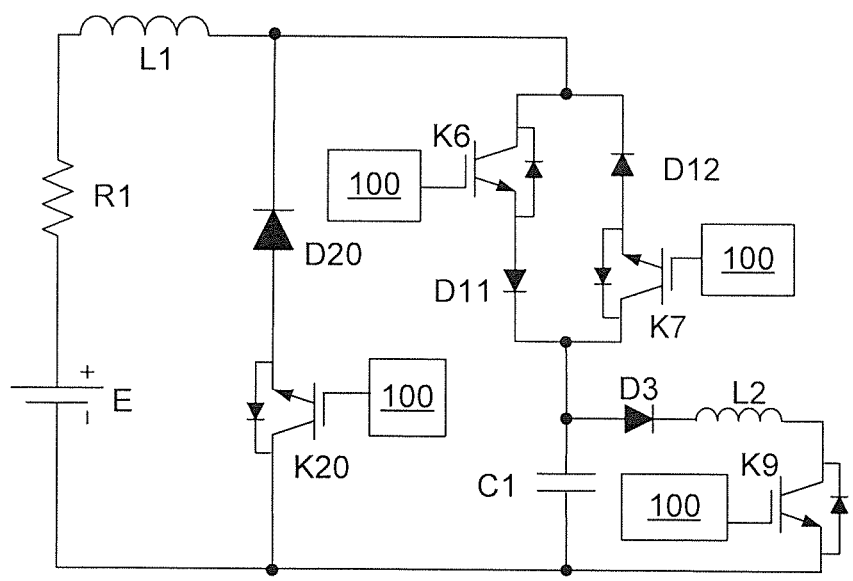
FIG. 20 is a schematic diagram of one embodiment of the battery heating circuit provided in the present invention.
Figure 21:
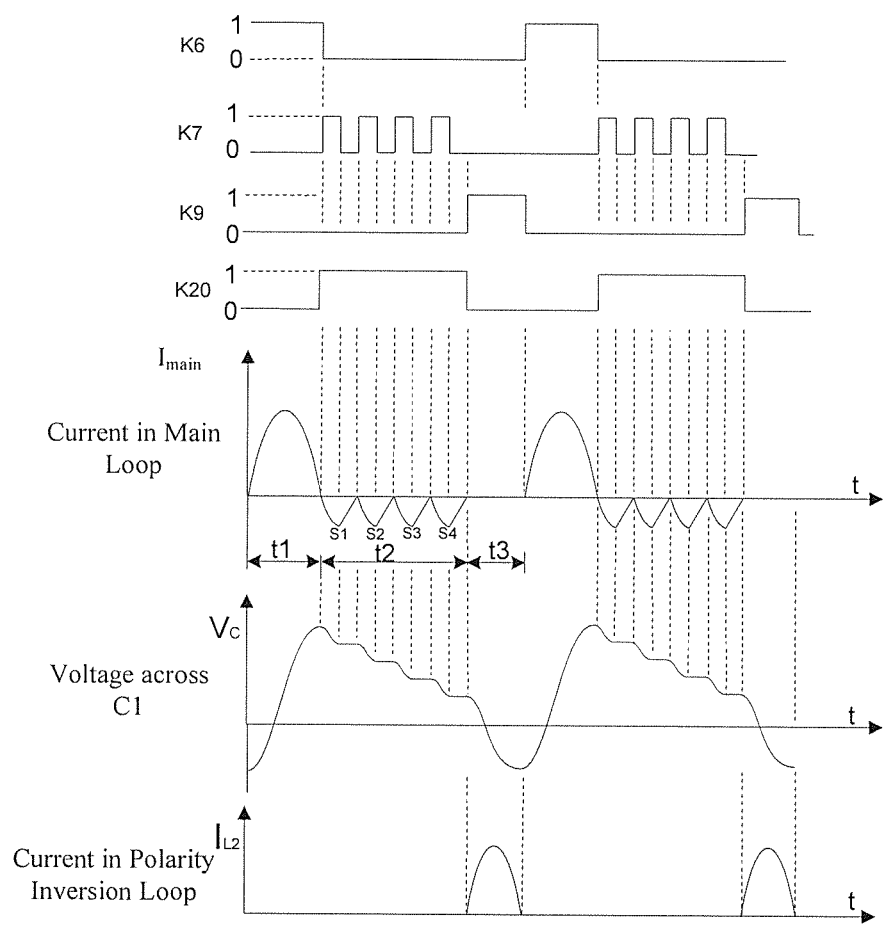
FIG. 21 is a timing sequence diagram of the waveform corresponding to the battery heating circuit shown in FIG. 20.
Figure 22:
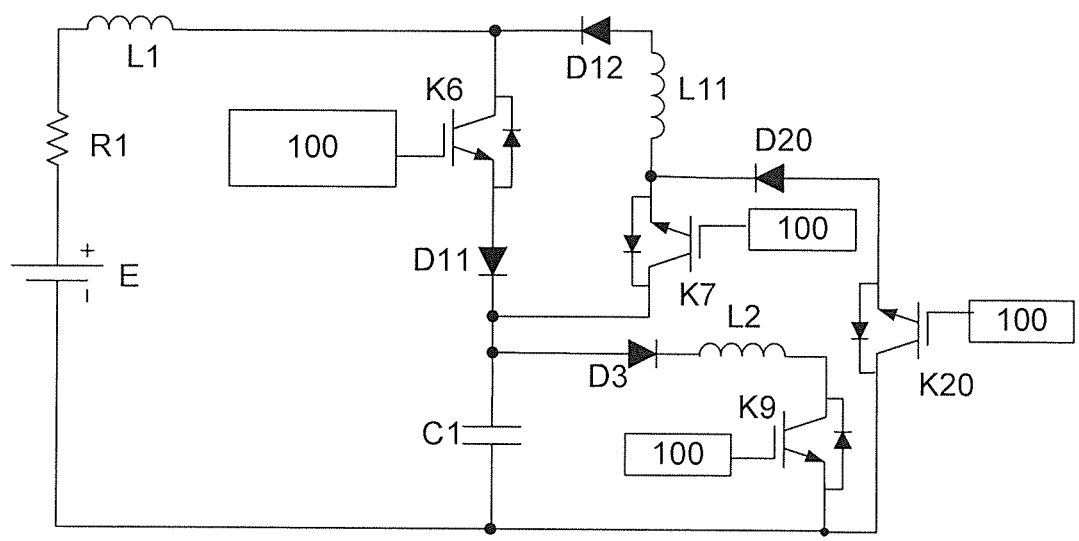
FIG. 22 is a schematic diagram of one embodiment of the battery heating circuit provided in the present invention.
Figure 23:
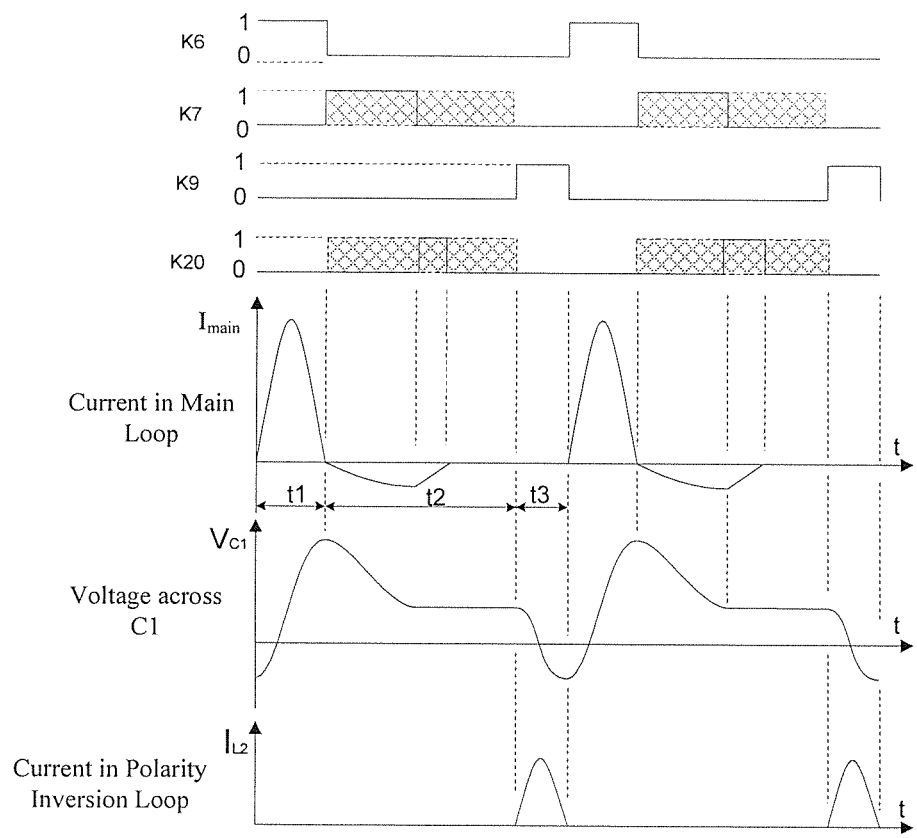
FIG. 23 is a timing sequence diagram of the waveform corresponding to the battery heating circuit shown in FIG. 22.
Figure 24:
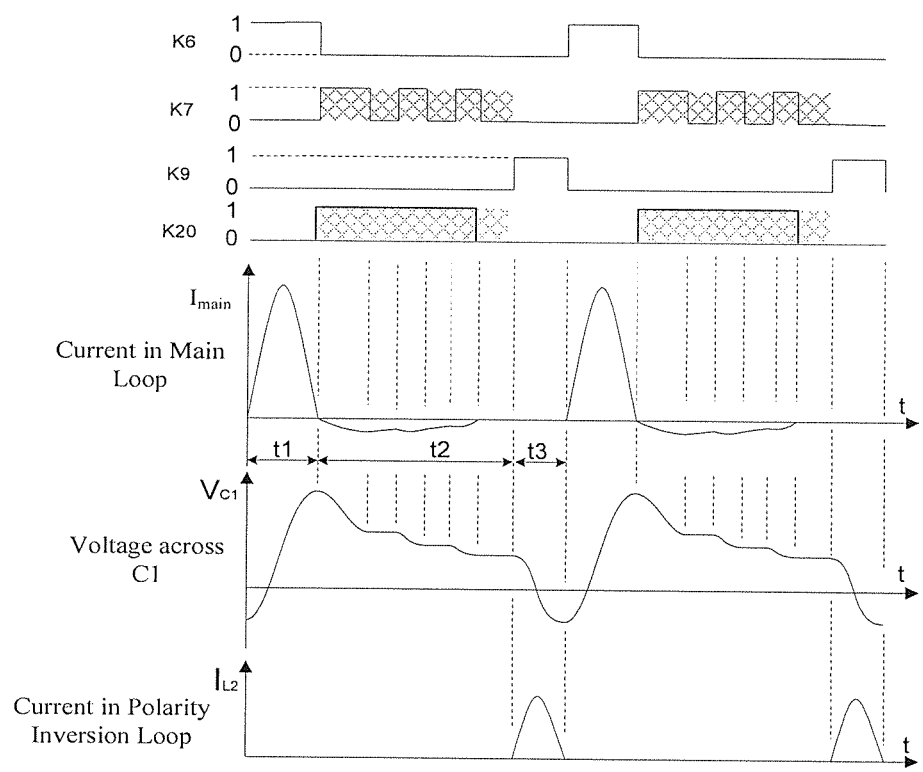
FIG. 24 is another timing sequence diagram of the waveform corresponding to the battery heating circuit shown in FIG. 22.

Hereunder the working process of the embodiments of the heating circuit for battery E will be introduced briefly with reference to FIG. 20-24, wherein: FIGS. 20 and 22 show embodiments of the heating circuit for battery E, while FIGS. 21, 23, and 24 show wave patterns corresponding to the embodiments. It should be noted: though the features and components of certain embodiments of the present invention are described specifically with reference to FIG. 20 and FIG. 22, each feature or component can be used separately without other features and components, or can be used in combination or not in combination with other features and components. The embodiments of the heating circuit for battery E are not limited to those shown in FIGS. 20 and 22. The grid parts of the wave patterns shown in FIGS. 21, 23, and 24 indicate drive pulses can be applied to the switch in one or more times within the period, and the pulse width can be adjusted as needed.

In the heating circuit for battery E shown in FIG. 20, the switch K6 and one-way semiconductor component D11 are connected in series to constitute the first one-way branch of the switch unit; the one-way semiconductor component D12 and switch K7 constitute the second one-way branch of the switch unit 1, the switch unit 1, damping component R1, charge storage component C1, and current storage component L1 are connected in series, the one-way semiconductor component D3, current storage component L2, and switch K9 constitute a polarity inversion unit 102, the one-way semiconductor component D20 and switch K20 constitute a freewheeling circuit 20, the switching control module 100 can control ON/OFF of the switch K6, switch K7, switch K9, and switch K20. FIG. 21 shows the wave pattern of the current Imain in the main loop of the heating circuit shown in FIG. 20, voltage VC1 across C1, and current IL2 in the polarity inversion loop. The working process of the heating circuit shown in FIG. 20 is as follows:

a) The switching control module 100 controls the switch K6 to switch on; as indicated by the time period t1 shown in FIG. 21, the battery E discharges in forward direction through the switch K6, one-way semiconductor component D11, and charge storage component C1 (as indicated by the time period t1 shown in FIG. 21), when the discharge in forward direction is completed, the switching control module 100 controls the switch K7 to switch on and controls the switch K7 to switch on and off time after time by adjusting the drive pulses applied to K7; the charge storage component C1 charges the battery E in reverse direction through the switch K7 and one-way semiconductor component D12 (as indicated by the time period t2 in FIG. 21); at the same time, the switching control module 100 controls the switch K20 to switch on, so that the diode D20 achieves current freewheeling function when K7 switches off, as indicated by the time period t2 in FIG. 21; S1~S4 represent the waveforms of current in main loop and sustained current when the switch K7 switches on and switches off time after time; it is seen: since the switch K7 is controlled to switch off when the current in the main circuit reaches a preset value, the magnitude of the current flowing to the battery E is limited; in addition, since the switch K20 in the freewheeling circuit 20 switches on, the current flowing to the battery E will be sustained after the switch K7 switches off.

b) The switching control module 100 controls the switch K6 and K20 to switch off when the current in reverse direction is the predetermined current value (e.g., zero).

c) The switching control module 100 controls the switch K9 to switch on, and therefore the polarity inversion unit 102 starts operation; the charge storage component C1 discharges through the loop composed by the one-way semiconductor component D3, current storage component L2, and switch K9, to attain the purpose of voltage polarity inversion; then, the switching control module 100 controls the switch K9 to switch off, as indicated by the time period t3 shown in FIG. 21.

d) Repeat step a) to step c); the battery E is heated up continuously while it discharges and is charged, till the battery E meets the heating stop condition.

In the heating circuit for battery E shown in FIG. 22, the switch K6 and one-way semiconductor component D11 are connected in series to constitute the first one-way branch of the switch unit 1, the one-way semiconductor component D12 and the switch K7 constitute the second one-way branch of the switch unit 1, the current storage component L11 is connected in series between the one-way semiconductor component D12 and the switch K7, to attain the purpose of current limitation; the one-way semiconductor component D3, current storage component L2, and switch K9 constitute a polarity inversion unit 102, the one-way semiconductor component D20 and switch K20 are connected in series to constitute a freewheeling circuit 20, one end of the freewheeling circuit is connected between the current storage component L11 and the switch K7 in the second one-way branch, and the other end of the freewheeling circuit is connected to the negative electrode of the battery; the switching control module 100 can control ON/OFF of switch K6, switch K7, switch K9, and switch K20. FIG. 23 and FIG. 24 show the wave patterns of the current in main loop Imain, voltage VC1 across C1, and current IL2 of the polarity inversion loop; in a cycle shown in FIG. 23, switch K7 switches on and switches off once; when the switch K7 switches off, the diode D20 sustains the current once; in the reversed charging process of battery E in a cycle in FIG. 24, the switch K7 is controlled to switch on and switch off in multiple times, and the current is sustained from the diode D20 whenever the switch K7 switches off. The working process of the heating circuit shown in FIG. 22 is as follows:

a) The switching control module 100 controls the switch K6 to switch on, as indicated by the time period t1 in FIGS. 23 and 24; thus the battery E discharges in forward direction through the switch K6, one-way semiconductor component D11, and charge storage component C1 (as indicated by the time period t1 in FIGS. 23 and 24); at the end of the discharge process in forward direction, the switching control module 100 controls the switch K7 to switch on (as shown in FIG. 23), or controls K7 to switch on and switch off time after time (as shown in FIG. 24); the charge storage component C1 charges the battery E in reverse direction through the switch K7, current storage component L11, and one-way semiconductor component D12 (as indicated by the time period t2 in FIGS. 23 and 24); owing to the existence of the current storage component L11, the magnitude of the current flowing to battery E is limited; at the same time, the switching control module 100 controls the switch K20 to switch on, so that the diode D20 achieves current freewheeling function when K7 switches off, as indicated by the time period t2 in FIGS. 23 and 24;

b) The switching control module 100 controls the switch K6 and K20 to switch off when the current in reverse direction is the predetermined current value (e.g., zero).

c) The switching control module 100 controls the switch K9 to switch on, and therefore the polarity inversion unit 102 starts operation; the charge storage component C1 discharges through the loop composed by the one-way semiconductor component D3, current storage component L2, and switch K9, to attain the purpose of voltage polarity inversion; then, the switching control module 100 controls the switch K9 to switch off, as indicated by the time period t3 shown in FIGS. 23 and 24;

d) Repeat step a) to step c); the battery E is heated up continuously while it discharges and is charged, till the battery E meets the heating stop condition.

Since the energy storage circuit is connected with the battery in series in the heating circuit, safety problem caused by over-current as short circuit related with failures of the switch unit can be avoided when the battery is heated due to the existence of the charge storage components C1 connected in series, and therefore the battery can be protected effectively.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A battery heating circuit, comprising:
    a switch unit, a switching control module, a damping component, an energy storage circuit, and a freewheeling circuit, wherein:
    the energy storage circuit is connected with the battery in a first loop, and comprises a current storage component and a charge storage component;
    the damping component, the switch unit, the current storage component, and the charge storage component are connected in series;
    the switching control module is connected with the switch unit, and is configured to control switching on and off of the switch unit so that current can flow back-and-forth between the battery and the energy storage circuit when the switch unit switches on, and amplitude of the current flowing from the energy storage circuit to the battery can be controlled;
    the freewheeling circuit is connected with the battery in a second loop, and is configured to sustain the current flowing to the battery when there is current flowing from the energy storage circuit to the battery and after the switch unit switches off.

2. The heating circuit according to claim 1, wherein: the damping component is a parasitic resistance in the battery, and the current storage component is a parasitic inductance in the battery.

3. The heating circuit according to claim 1, wherein: the damping component is a resistor, the current storage component is an inductor, and the charge storage component is a capacitor.

4. The heating circuit according to claim 1, wherein:
    the switch unit comprises a first one-way branch configured to enable current flow from the battery to the energy storage circuit and a second one-way branch configured to enable current flow from the energy storage circuit to the battery;
    the switching control module is connected to the first one-way branch and the second one-way branch respectively, and is configured to control turning on and off of the connected branches.

5. The heating circuit according to claim 4, wherein: the freewheeling circuit is connected in parallel between the ends of the battery.

6. A battery heating circuit, comprising:
    a switch unit, a switching control module, a damping component, an energy storage circuit, and a freewheeling circuit, wherein:
    the energy storage circuit is connected with the battery, and comprises a current storage component and a charge storage component;
    the damping component, the switch unit, the current storage component, and the charge storage component are connected in series;
    the switching control module is connected with the switch unit, and is configured to control ON/OFF of the switch unit so that the energy can flow back-and-forth between the battery and the energy storage circuit when the switch unit switches on, and amplitude of the current flowing from the energy storage circuit to the battery can be controlled;
    the freewheeling circuit is configured to sustain the current flowing to the battery when there is current flowing from the energy storage circuit to the battery and after the switch unit switches off;
    the switch unit comprises a first one-way branch configured to enable energy flow from the battery to the energy storage circuit and a second one-way branch configured to enable energy flow from the energy storage circuit to the battery;
    the switching control module is connected to the first one-way branch and the second one-way branch respectively, and is configured to control ON/OFF of the connected branches;
    the switch unit comprises a first switch, a second switch, a first one-way semiconductor component, and a second one-way semiconductor component;
    the first switch and the first one-way semiconductor component are connected in series with each other to form the first one-way branch, and the second switch and the second one-way semiconductor component are connected in series with each other to form the second one-way branch; and
    the switching control module is connected with the first switch and the second switch to control ON/OFF of the first one-way branch and the second one-way branch by controlling ON/OFF of the first switch and the second switch.

7. The heating circuit according to claim 6, wherein: one end of the freewheeling circuit is connected between the second switch and the second one-way semiconductor component in the second one-way branch, and the other end of the freewheeling circuit is connected to the battery.

8. The heating circuit according to claim 4, wherein:
the freewheeling circuit comprises a switch and a one-way semiconductor component connected in series with each other;
the switching control module is connected with the switch, and is configured to control the switch to switch on when there is current flowing from the energy storage circuit to the battery and after the switch unit switches off, and control the switch to switch off when the current flowing from the energy storage circuit to the battery reaches a predetermined current value.

9. The heating circuit according to claim 4, wherein: the heating circuit further comprises an energy superposition unit, which is connected with the energy storage circuit, and is configured to superpose the energy in the energy storage circuit with the energy in the battery after the switching control module controls the switch unit to switch on and then to switch off.

10. The heating circuit according to claim 9, wherein: the energy superposition unit comprises a polarity inversion unit, which is connected with the energy storage circuit, and is configured to invert the voltage polarity of the charge storage component after the switch unit switches on and then switches off.

11. The heating circuit according to claim 4, wherein: the heating circuit further comprises an energy transfer unit, which is connected with the energy storage circuit, and is configured to transfer the energy in the energy storage circuit to an energy storage component after the switch unit switches on and then switches off.

12. The heating circuit according to claim 11, wherein: the energy storage component is the battery, and the energy transfer unit comprises an electricity recharge unit, which is connected with the energy storage circuit, and is configured to transfer the energy in the energy storage circuit to the energy storage component after the switch unit switches on and then switches off.

13. The heating circuit according to claim 4, wherein:
the heating circuit further comprises an energy superposition and transfer unit connected with the energy storage circuit; and
the energy superposition and transfer unit is configured to transfer the energy in the energy storage circuit to an energy storage component after the switch unit switches on and then switches off and then superpose the remaining energy in the energy storage circuit with the energy in the battery.

14. The heating circuit according to claim 13, wherein:
the energy superposition and transfer unit comprises an energy superposition unit and an energy transfer unit;
the energy transfer unit is connected with the energy storage circuit, and is configured to transfer the energy in the energy storage circuit to an energy storage component after the switch unit switches on and then switches off; and
the energy superposition unit is connected with the energy storage circuit, and is configured to superpose the remaining energy in the energy storage circuit with the energy in the battery after the energy transfer unit performs energy transfer.

15. The heating circuit according to claim 14, wherein:
the energy storage component is the battery, and the energy transfer unit comprises an electricity recharge unit, which is connected with the energy storage circuit, and is configured to transfer the energy in the energy storage circuit to the energy storage component after the switch unit switches on and then switches off; and
the energy superposition unit comprises a polarity inversion unit, which is connected with the energy storage circuit, and is configured to invert the voltage polarity of the charge storage component after the electricity recharge unit performs energy transfer.

16. The heating circuit according to claim 13, wherein:
the energy superposition and transfer unit comprises a DC-DC module, which is connected with the charge storage component and the battery respectively;
the switching control module is also connected with the DC-DC module, and is configured to control the operation of the DC-DC module to transfer the energy in the charge storage component to the energy storage component, and then superpose the remaining energy in the charge storage component with the energy in the battery.

17. The heating circuit according to claim 10, wherein:
the polarity inversion unit comprises a first single-pole double-throw switch and a second single-pole double-throw switch located on the two ends of the charge storage component respectively;
the input wires of the first single-pole double-throw switch are connected in the energy storage circuit, the first output wire of the first single-pole double-throw switch is connected with the first pole plate of the charge storage component, and the second output wire of the first single-pole double-throw switch is connected with the second pole plate of the charge storage component;
the input wires of the second single-pole double-throw switch are connected in the energy storage circuit, the first output wire of the second single-pole double-throw switch is connected with the second pole plate of the charge storage component, and the second output wire of the second single-pole double-throw switch is connected with the first pole plate of the charge storage component;
the switching control module is also connected with the first single-pole double-throw switch and second single-pole double-throw switch respectively, and is configured to invert the voltage polarity of the charge storage component by altering the connection relationships between the respective input wires and output wires of the first single-pole double-throw switch and the second single-pole double-throw switch.

18. The heating circuit according to claim 10, wherein:
the polarity inversion unit comprises a one-way semiconductor component, a second current storage component, and a third switch;
the charge storage component, the second current storage component, and third switch are connected sequentially in series to form a loop;
the one-way semiconductor component is connected in series between the charge storage component and the second current storage component or between the second current storage component and the third switch; and
the switching control module is also connected with the third switch, and is configured to invert the voltage polarity of the charge storage component by controlling the third switch to switch on.

19. The heating circuit according to claim 10, wherein:
the polarity inversion unit comprises a DC-DC module and a second charge storage component;
the DC-DC module is connected with the charge storage component and the second charge storage component respectively; and the switching control module is also connected with the DC-DC module, and is configured to transfer the energy in the charge storage component to the second charge storage component by controlling the operation of the DC-DC module, and then transfer the energy in the second charge storage component back to the charge storage component, so as to invert the voltage polarity of the charge storage component.

20. The heating circuit according to claim 12, wherein:
the electricity recharge unit comprises a DC-DC module (3), which is connected with the charge storage component and the battery respectively; and
the switching control module (100) is also connected with the DC-DC module, and is configured to transfer the energy in the charge storage component to the battery by controlling the operation of the DC-DC module.

21. The heating circuit according to claim 4, wherein: the heating circuit further comprises an energy consumption unit, which is connected with the charge storage component and configured to consume the energy in the charge storage component after the switch unit switches on and then switches off.

22. The heating circuit according to claim 21, the energy consumption unit comprises a voltage control unit, which is configured to convert the voltage across the charge storage component to a predetermined value of voltage after the switch unit switches on and then switches off.

23. The heating circuit according to claim 9, wherein: the heating circuit further comprises an energy consumption unit, which is connected with the charge storage component, and is configured to consume the energy in the charge storage component after the switch unit switches on and then switches off and before the energy superposition unit performs energy superposition.

24. The heating circuit according to claim 23, wherein: the energy consumption unit comprises a voltage control unit, which is connected with the charge storage component, and is configured to convert the voltage across the charge storage component to a predetermined value of voltage after the switch unit switches on and then switches off and before the energy superposition unit performs energy superposition.

25. The heating circuit according to claim 11, wherein: the heating circuit further comprises an energy consumption unit, which is connected with the charge storage component, and is configured to consume the energy in the charge storage component after the switch unit switches on and then switches off and before the energy transfer unit performs energy transfer, or consume the energy in the charge storage component after the energy transfer unit performs energy transfer.

26. The heating circuit according to claim 25, wherein: the energy consumption unit comprises a voltage control unit, which is connected with the charge storage component, and is configured to convert the voltage across the charge storage component to a predetermined value of voltage after the switch unit switches on and then switches off and before the energy transfer unit performs energy transfer, or convert the voltage across the charge storage component to a predetermined value of voltage after the energy transfer unit performs energy transfer.

27. The heating circuit according to claim 13, wherein: the heating circuit further comprises an energy consumption unit, which is connected with the charge storage component, and is configured to consume the energy in the charge storage component after the switch unit switches on and then switches off and before the energy superposition and transfer unit performs energy transfer, or consume the energy in the charge storage component after the energy superposition and transfer unit performs energy transfer and before the energy superposition and transfer unit performs energy superposition.

28. The heating circuit according to claim 27, wherein: the energy consumption unit comprises a voltage control unit, which is connected with the charge storage component, and is configured to convert the voltage across the charge storage component to a predetermined value of voltage after the switch unit switches on and then switches off and before the energy superposition and transfer unit performs energy transfer, or convert the voltage across the charge storage component to a predetermined value of voltage after the energy superposition and transfer unit performs energy transfer and before the energy superposition and transfer unit performs energy superposition.

29. The heating circuit according to claim 22, wherein:
the voltage control unit comprises a second damping component and a fourth switch, the second damping component and the fourth switch are connected with each other in series, and then connected in parallel across the charge storage component; and
the switching control module is further connected with the fourth switch, and is configured to control the fourth switch to switch on after the control switch unit switches on and then switches off.

30. The heating circuit according to claim 9, wherein: the switching control module is configured to control the switch unit to switch off when or after the current flow through the switch unit reaches zero after the switch unit switches on.

31. The heating circuit according to claim 4, wherein: the heating circuit further comprises an energy limiting circuit, which is configured to limit the magnitude of the current flowing from the energy storage circuit to the battery.

32. The heating circuit according to claim 31, wherein: the energy limiting circuit comprises a third current storage component, which is connected in series in the second one-way branch of the switch unit.

* * * * *